(12) United States Patent
Hirao

(10) Patent No.: US 6,788,082 B2
(45) Date of Patent: Sep. 7, 2004

(54) PROBE CARD

(75) Inventor: Masayoshi Hirao, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/628,358

(22) Filed: Jul. 29, 2003

(65) Prior Publication Data
US 2004/0036491 A1 Feb. 26, 2004

(30) Foreign Application Priority Data
Aug. 23, 2002 (JP) ........................................ 2002-243652

(51) Int. Cl.$^7$ .............................................. G01R 31/02
(52) U.S. Cl. ....................... 324/757; 324/158.1; 257/48
(58) Field of Search ................................ 324/757, 765, 324/754, 158.1, 763; 439/482, 700; 257/48, 415; 438/14, 18, 17

(56) References Cited

U.S. PATENT DOCUMENTS

| 5,550,480 A | * | 8/1996 | Nelson et al. ............... 324/754 |
| 5,962,868 A | * | 10/1999 | Tanida ........................... 257/48 |
| 6,448,798 B1 | * | 9/2002 | Shinmori ..................... 324/763 |

FOREIGN PATENT DOCUMENTS

| JP | 60-142526 | 7/1985 |
| JP | 5-347335 | 12/1993 |
| JP | 6-120313 | 4/1994 |
| JP | 8-299210 | 11/1996 |

* cited by examiner

Primary Examiner—Kamand Cuneo
Assistant Examiner—Jimmy Nguyen
(74) Attorney, Agent, or Firm—Oblon, Spivak, McCelland, Maier & Neustadt, P.C.

(57) ABSTRACT

A balance resistance is connected to each probe pin and a probe card check wire is provided on each probe pin, and thus a wafer test and chip test with application of high current can be performed, and further, a maintenance of a probe card is facilitated.

3 Claims, 10 Drawing Sheets

PROBE CARD

BACKGROUND OF THE INVENTION

1. Field of the Invention

The present invention generally relates to a probe card, and more particularly to a probe card used for measurement in a test for electrical performance of a semiconductor device in a wafer state and chip state during its production process. In particular, the present invention relates to a probe card used for testing a semiconductor power device in a wafer state and chip state.

2. Description of the Prior Art

A semiconductor power device is generally subject to a three-stage test including a wafer test, chip test and final test before it is shipped to a user. The wafer test is performed in a wafer state, while the chip test is performed in a chip state after the wafer is diced. The final test is performed after the chip of the power device is incorporated into a mold to be assembled into a module and before it is shipped to a user.

The wafer test and chip test are performed in order to prevent possible inflow of defective chips in an assembling process, i.e., in order to best reject possible defective chips in a chip state.

This is because the production cost can be suppressed lower on the whole with the more reduced inflow of defective chips in the assembling process. On the contrary, increased rate of the inflow of defective chips in the assembling process requires a discard of not only a defective chip but also a module itself. Specifically, even incorporated non-defective chip or other non-defective elements are required to be discarded. Accordingly, the production cost is increased on the whole. Therefore, it is important to enhance a precision in rejecting defective chips during the wafer test and chip test in order to reduce the production cost.

Further, the wafer test and chip test have to be performed under a condition close to the final test for enhancing the precision in rejecting defective chips during these tests. In particular, since the power device has a great current capacity, it is required to be tested with high current as great as possible in the wafer test and chip test.

A probe card is generally used for performing the wafer test or chip test. There is a limitation on current capacity flowing per one spring probe needle (hereinafter referred to as "pin" or "needle") made of tungsten or the like mounted on the probe card. Therefore, in the case where current exceeding the limitation is required to flow, a plurality of pins (or needles) are electrically short-circuited for use. Specifically, as shown in FIG. 9, a plurality of pins (or needles) electrically short-circuited for use are brought into contact with the same electrode pad of the semiconductor device chip.

FIG. 9 is an equivalent circuit diagram of a conventional probe card configuration, wherein n pieces of pins (or needles) are brought into contact with a pad surface 91 of a chip, and a current I is applied to flow through the pins. In this figure, $P_1, P_2, P_3, \ldots P_N$ represent each pin (or needle), while $r_1, r_2, r_3, \ldots, r_n$ indicate each contact resistance between these pins (or needles) and the pad of the chip.

However, the above-mentioned conventional probe card has problems as to be described below. Specifically, the first problem is such that, even if a plurality of pins (or needles) are brought into contact with the same pad 91 in order to flow a high current as shown in FIG. 9, a deviated flow occurs in current flowing through each pin (or needle), since the respective contact resistances $r_1, r_2, r_3, \ldots, r_n$ are not uniform.

Specifically, the variation in current flowing through each pin (or needle) is influenced by the variation of the contact resistances between each pin (or needle) and the pad. The current is concentrated on the pin having the smallest contact resistance, which results in that this pin (or needle) is broken down. When one pin is broken down, the current is then concentrated on the one having the second smallest contact resistance. As a result, a breakdown of pins may occur one after another.

As described above, concentration of current on a part of the pins (or needles) entails problems of a burnout of the pad of the chip, a burnout of pins (or needles), or concentrated current in a part of the pad, resulting in that a test cannot be measured with high precision.

In order to solve the above-mentioned problems, Japanese Patent Unexamined (Laid-open) Publication No. 60-142526 (1985) discloses a technique such that each contact resistance is provided between a semiconductor device to be tested for its electrical performance and each of the plural pins (probe needles) on a probe card, and that resistances greater than each contact resistance are inserted to each pin in series. This arrangement equalizes current values flowing though the pins, thereby preventing a breakdown of a pin during the test measurement. The resistance inserted in series in each pin for well-balanced flowing of high current is referred to as "balance resistance" in the following explanation.

This conventional technique discloses a method for well-balancedly carrying a high current through each pin, but it has no teaching about a check method for checking whether each pin on the probe card has a defect or not. Accordingly, there has been a problem in bringing the conventional technique into practical use.

There is a second problem such that, a pin (or needle) on a probe card has stains or the like attached on a tip end thereof while it is repeatedly used for a performance test of a semiconductor device, resulting in that a contact resistance between the tip end of the pin and a testing pad section varies and in some cases a spring characteristic of the pin is deteriorated to thereby increase a contact resistance.

The variation in the contact resistance brings an incorrect measurement result of a performance test of a semiconductor device. Therefore, a regular check of pins (or needles) on a probe card is required for checking in daily life whether a defect is present or not on each pin (or needle). If a pin having some defect is observed, this defective pin should be replaced.

In FIG. 10, a probe card checker (shown by a reference numeral 101) is used for checking a pin (or needle) on a probe card. Specifically, as shown by a probe card checker disclosed in Japanese Patent Unexamined (Laid-open) Publication No. 8-299210 (1996), a pin (or needle) on a probe card is brought into elastic contact with a metal plate of the checker for measuring an electrical resistance between the metal plate and a connector electrode of the probe card, whereby an abnormal state of each pin (or needle) can be checked.

In this method, however, in the case where a plurality of pins (or needles) are brought into contact with the same pad for causing an electrical short-circuit as shown in FIG. 10, the contact resistances between all pins (or all needles) and a metal plate 102 for checking the probe card are connected in parallel. Therefore, this technique has a problem that, even though the abnormal state of the entire pins (or needles) can be checked, a check as to whether there is an abnormal state on a part of or individual pin (or needle) cannot be performed.

Further, Japanese Patent Unexamined (Laid-open) Publication No. 5-347335 (1993) discloses a technique of providing in series on-off change-over switches on each probe needle. Only a switch on a probe needle to be checked is turned on upon checking a probe needle while the other switches are turned off, so that a check per one probe needle can be performed.

However, when a balance resistance for flowing a high current is connected to each probe needle, the balance resistance enters in series upon checking each probe needle, thereby being unable to check in this configuration. Therefore, this configuration cannot be applied to a probe card to which a balance resistance for a high current is mounted.

Japanese Patent Unexamined (Laid-open) Publication No. 6-120313 (1994) discloses a technique such that another probe needle for checking a contact state of a probe needle is provided separate from a probe needle for testing a chip in order to check the probe needle during a wafer test. The disclosure shows that a resistance between these probe needles is measured to check whether a contact defect of the probe needle is present or not.

However, when a balance resistance is connected to each probe needle, the balance resistance enters in series upon checking each probe needle, thereby being unable to check in this configuration. Therefore, this configuration cannot be applied to a probe card to which a balance resistance for high current is mounted.

SUMMARY OF THE INVENTION

The present invention has been made to solve these problems and has an object to provide a probe card wherein, in the case where a plurality of probe pins are electrically short-circuited for use, well-balanced current can be flown through each probe pin to prevent a burnout of a chip pad as well as a burnout of the probe pins due to concentrated current flow on a part of the pins, thereby enhancing a measuring precision of a test, and further even if a plurality of probe pins are electrically short-circuited for use, confirmation can individually be made as to whether each of the probe pins has a defect or not.

Additionally, the present invention aims to provide a probe card that can individually check as to whether each probe pin has a defect or not in a normal probe card substrate, even in the case where connector electrodes for checking a contact with a chip is lacking in number.

Further, the present invention aims to realize an improved probe card with use of a conventional probe card checker as it is.

In order to attain the above-mentioned objects, a probe card according to the present invention is used in a performance test of a chip of a semiconductor device in a production process of the semiconductor device. The probe card includes a plurality of probe pins for flowing a high current therethrough for the test. Each of the probe pins has a balance resistance connected thereto in series, and a each balance resistance is greater in value than a contact resistance which is produced between each of the probe pins and a chip pad of the semiconductor device when contacted with each other.

A plurality of contact check wires are respectively connected to the probe pins for checking a contact performance of each of the probe pins, wherein each of the contact check wires is drawn from a junction point positioned between each of the probe pins and a corresponding balance resistance connected thereto.

By this configuration, a high applied current can be well-balanced to flow through each probe pin, to thereby prevent a burnout of a chip pad as well as a burnout of the probe pins due to concentrated current flow on a part of the probe pins, Thus, a measuring precision of a test can be improved, and further makes it possible to individually check as to whether each probe pin has a defect or not even in the case where a plurality of the probe pins are electrically short-circuited for use.

BRIEF DESCRIPTION OF THE DRAWINGS

These and other objects and features of the present invention will be readily understood from the following detailed description taken in conjunction with preferred embodiments thereof with reference to the accompanying drawings.

DETAILED DESCRIPTION OF THE PREFERRED EMBODIMENTS

Figure 1:
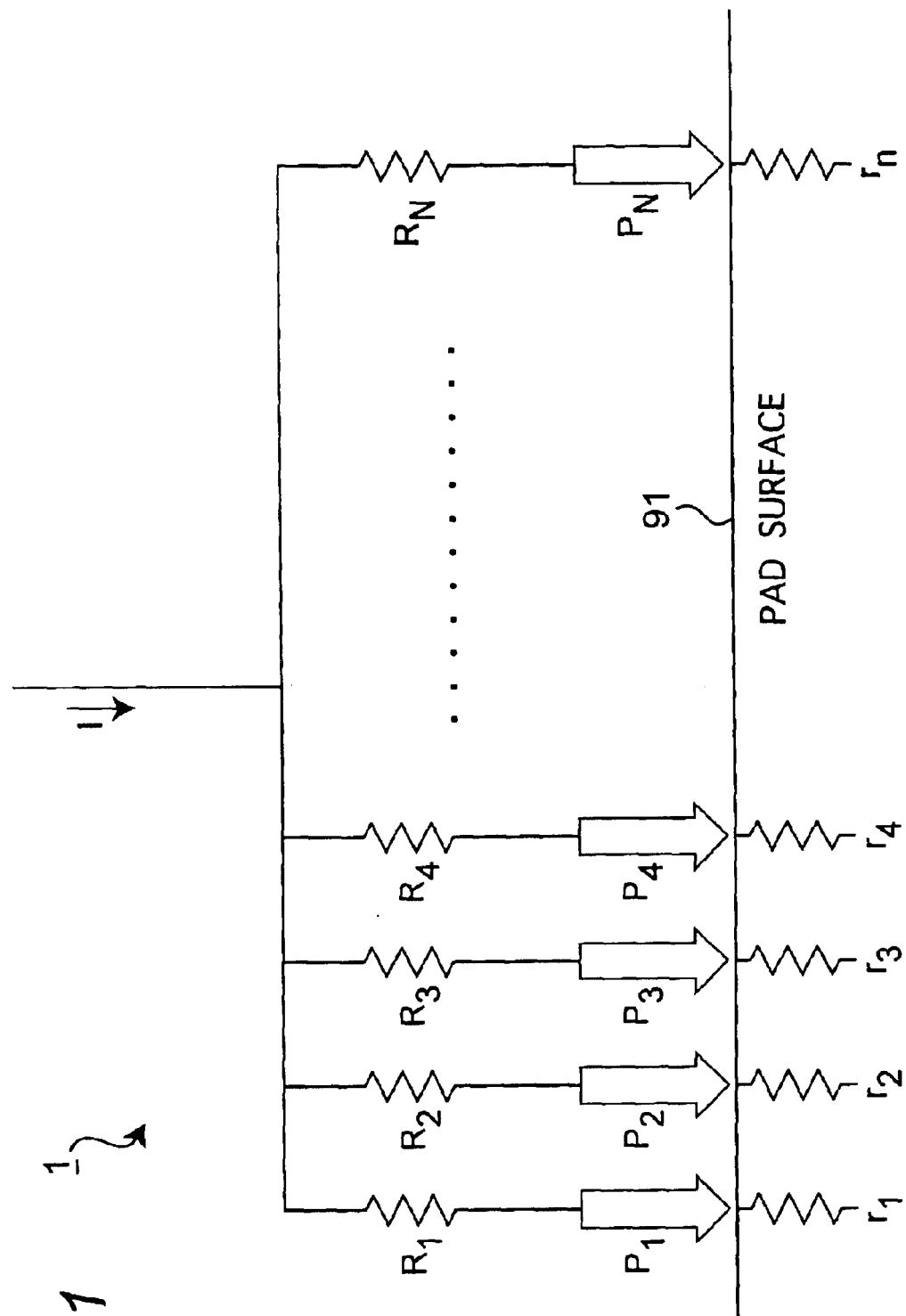
FIG. 1 is an equivalent circuit diagram for explaining a basic configuration of a probe card according to the present invention.

Before the description proceeds, it is to be noted that, since the basic structures of the preferred embodiments are in common, like parts are designated by the same reference numerals throughout the accompanying drawings, and the overlapped explanations are omitted here.

FIG. 1 is a view for explaining a basic configuration of a probe card 1 according to the present invention, and more particularly shows an equivalent circuit diagram in the case where the probe card 1 is brought into contact with a pad of a semiconductor chip to be tested with a current I flowing. In the figure, the probe card is provided with n pieces of spring pins (or needles) in contact with a pad of a chip, and each of the pins has a balance resistance inserted in connection thereto in series for carrying a high current. Symbols $P_1, P_2, P_3, \ldots, P_n$ represent each the pins, while $r_1, r_2, r_3, \ldots, r_n$ represent each of contact resistances between the pins and the pad of the chip. Symbols $R_1, R_2, R_3, \ldots, R_n$ represent each of balance resistances connected to these pins in series.

It is assumed that, each of the balance resistances $R_1, R_2, R_3, \ldots, R_n$ has the same resistance value which is far greater than the value of each of the contact resistances $r_1, r_2, r_3, \ldots, r_n$. Accordingly, a current $I_{Pk}$ flowing through an optional pin $P_k$ connected with a balance resistance $R_k$ which is one of the balance resistances $R_1, R_2, R_3, \ldots, R_n$ is represented by an equation as below:

$$I_{pk} = \frac{\frac{1}{r_k + R_k}}{\frac{1}{r_1 + R_1} + \frac{1}{r_2 + R_2} + \frac{1}{r_3 + R_3} + \cdots + \frac{1}{r_n + R_n}} \times I$$

$$\approx \frac{\frac{1}{R_k}}{\frac{1}{R_1} + \frac{1}{R_2} + \frac{1}{R_3} + \cdots + \frac{1}{R_n}} \times I$$

$$\approx \frac{I}{n}$$

This shows that a current equally flows through each pin (or needle) by 1/n of the applied current I.

This prevents a breakdown of the chip pad due to concentrated current flow on a part of pins and also prevents a breakdown of the pins or needles on the probe card, thereby enhancing the test measurement accuracy.

Embodiment 1

Figure 2:
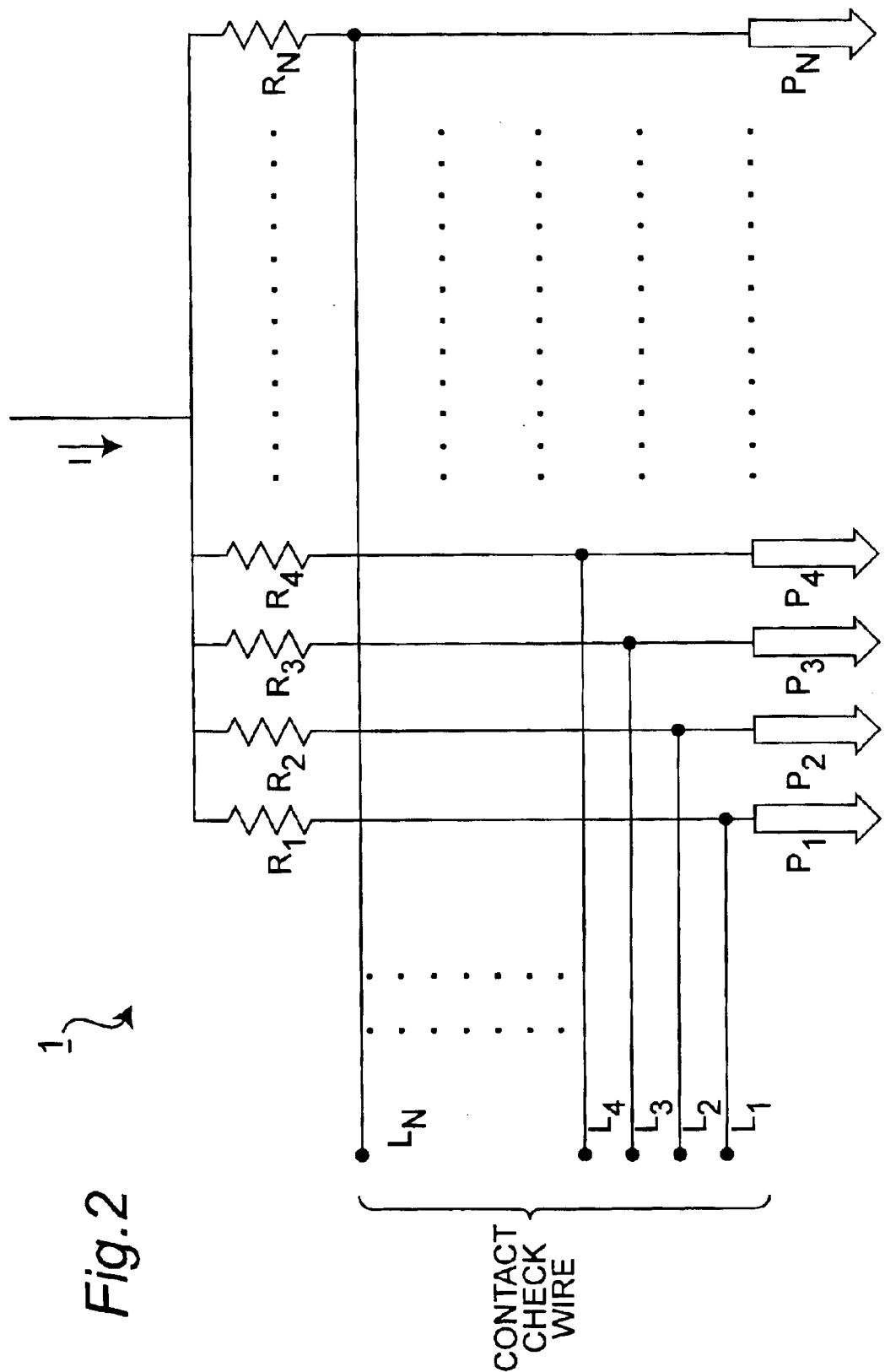
FIG. 2 is an equivalent circuit diagram of a probe card according to an embodiment 1 of the present invention.

FIG. 2 is an equivalent circuit diagram showing an example of a preferable configuration of a probe card 1 according to an embodiment 1 of the present invention. This embodiment 1 shows an equivalent circuit diagram having a probe card configuration in which wires $L_1, L_2, L_3, \ldots, L_n$ for checking a contact of the probe card are connected from n pieces of pins $P_1, P_2, P_3, \ldots, P_n$ having respective balance resistances $R_1, R_2, R_3, \ldots, R_n$ connected thereto. As shown in FIG. 2, each of the contact check wires is drawn from a junction point positioned between each pin and a corresponding balance resistance connected thereto.

Figure 3:
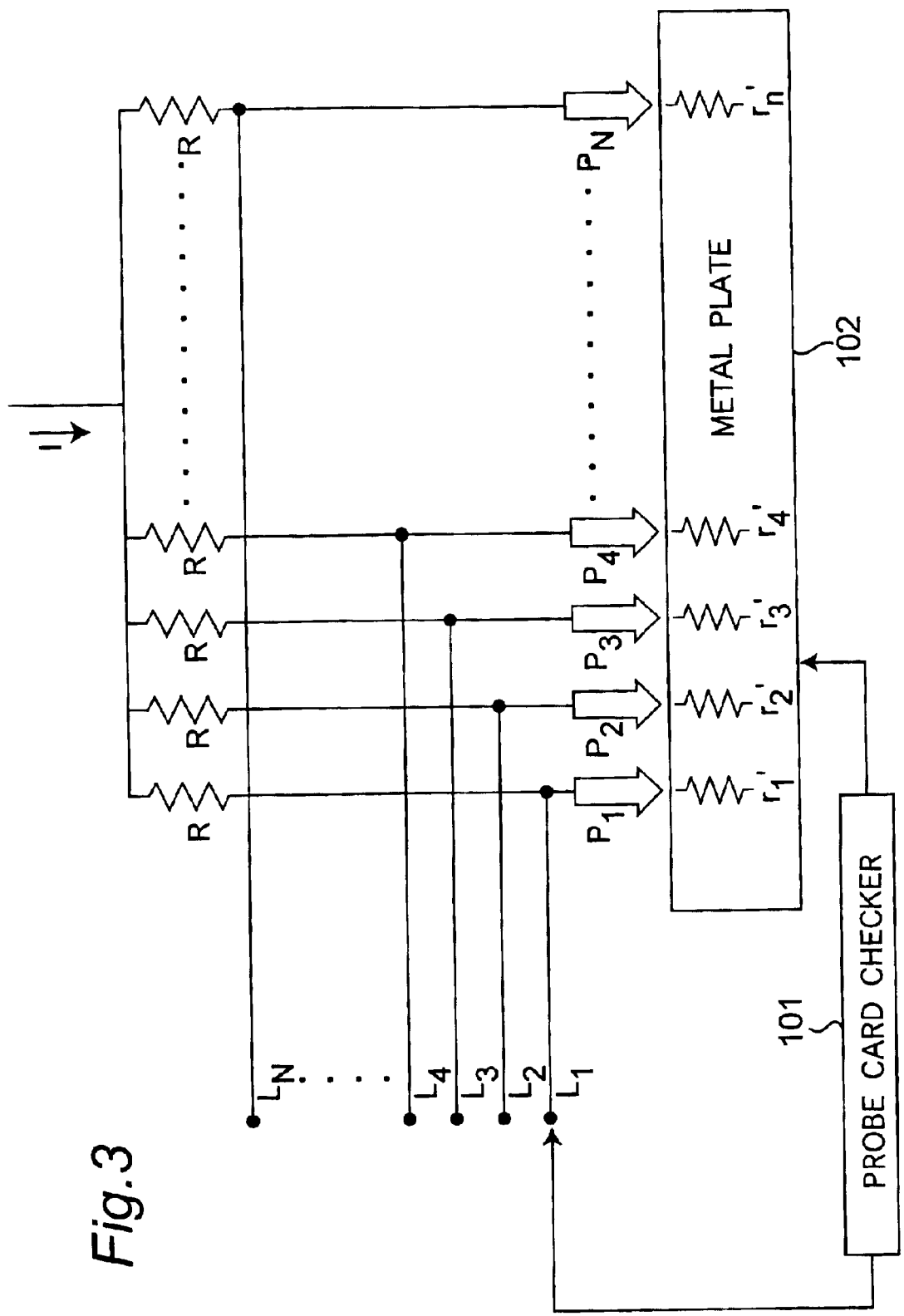
FIG. 3 is an equivalent circuit diagram when performing a contact check of the probe card shown in FIG. 2.

FIG. 3 is an equivalent circuit diagram in the case where a contact check of pins in the probe card shown in FIG. 2 is performed using a probe card checker 101. Symbols $P_1$ to $P_N$ represent pins, R represents a balance resistance and $r_1'$ to $r_n'$ represent contact resistances between each pin $P_1$ to $P_N$ and a metal plate 102 for use with the probe card checker.

In FIG. 3, the contact resistances $r_1'$ to $r_n'$ are measured to perform a contact check of each pin $P_1$ to $P_N$. Thus, the pins on the probe card are brought into contact with the metal plate for the probe card checker to perform the contact check.

In the above-mentioned configuration, when attention is put on, e.g., the first pin $P_1$, this configuration shows that the following resistance is connected in parallel to the contact resistance $r_1'$ upon the probe card check:

$$R_1 + \frac{1}{\frac{1}{r_2 + R_2} + \frac{1}{r_3 + R_3} + \frac{1}{r_4 + R_4} + \cdots + \frac{1}{r_n + R_n}}$$

However, the balance resistance $R_1$ connected to the first pin $P_1$ is far greater than the contact resistance $r_1'$ upon the probe card check, and therefore these balance resistances do not act as obstacles when checking whether the contact resistance $r_1'$ is good or not. It is to be noted that, since the metal plate subject to a gold plating is normally used, the contact resistance $r_1'$ upon the probe card check is far smaller than the contact resistance $r_1$ between the chip pad and the pin.

Similarly, the contact check for each pin can individually be executed with respect to the second and the following pins $P_2$ to $P_n$. It is to be noted that the configuration shown in FIG. 3 illustrates the case where each of the balance resistances has the same resistance value R.

Embodiment 2

Figure 4:
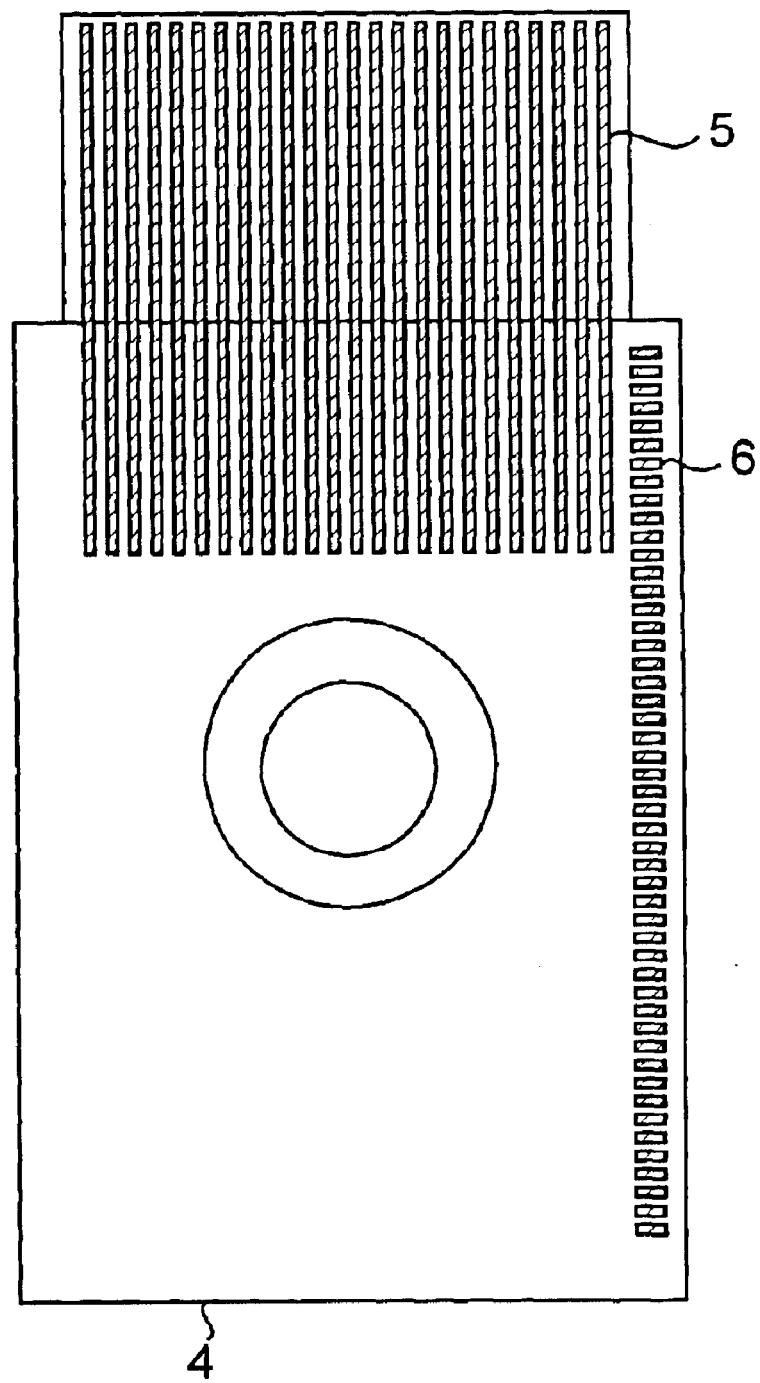
FIG. 4 is a top plan view showing one example of a substrate of a probe card according to an embodiment 2 of the present invention.
Figure 5:
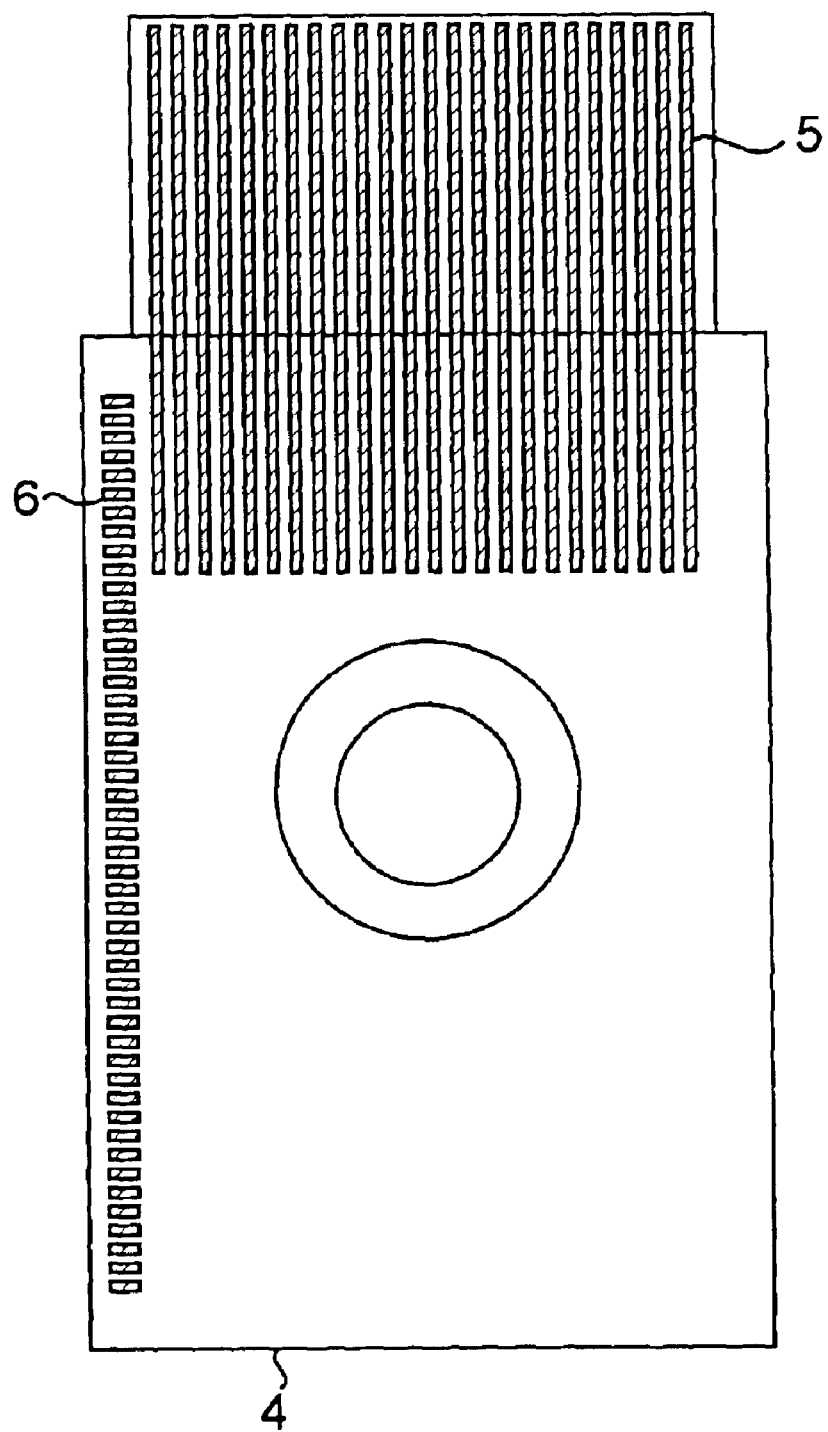
FIG. 5 is a top plan view showing one example of a substrate of a probe card according to the embodiment 2 of the present invention.
Figure 6:
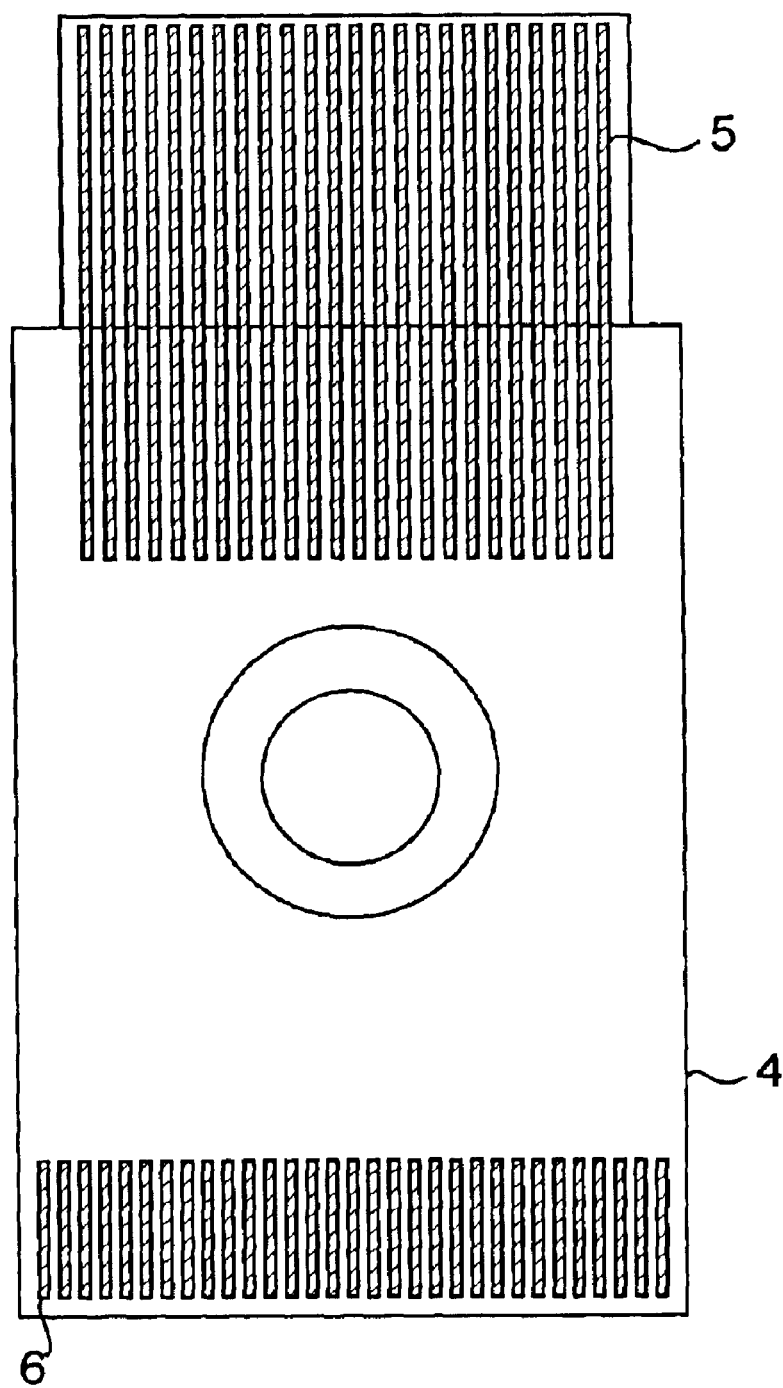
FIG. 6 is a top plan view showing one example of a substrate of a probe card according to the embodiment 2 of the present invention.
Figure 7:
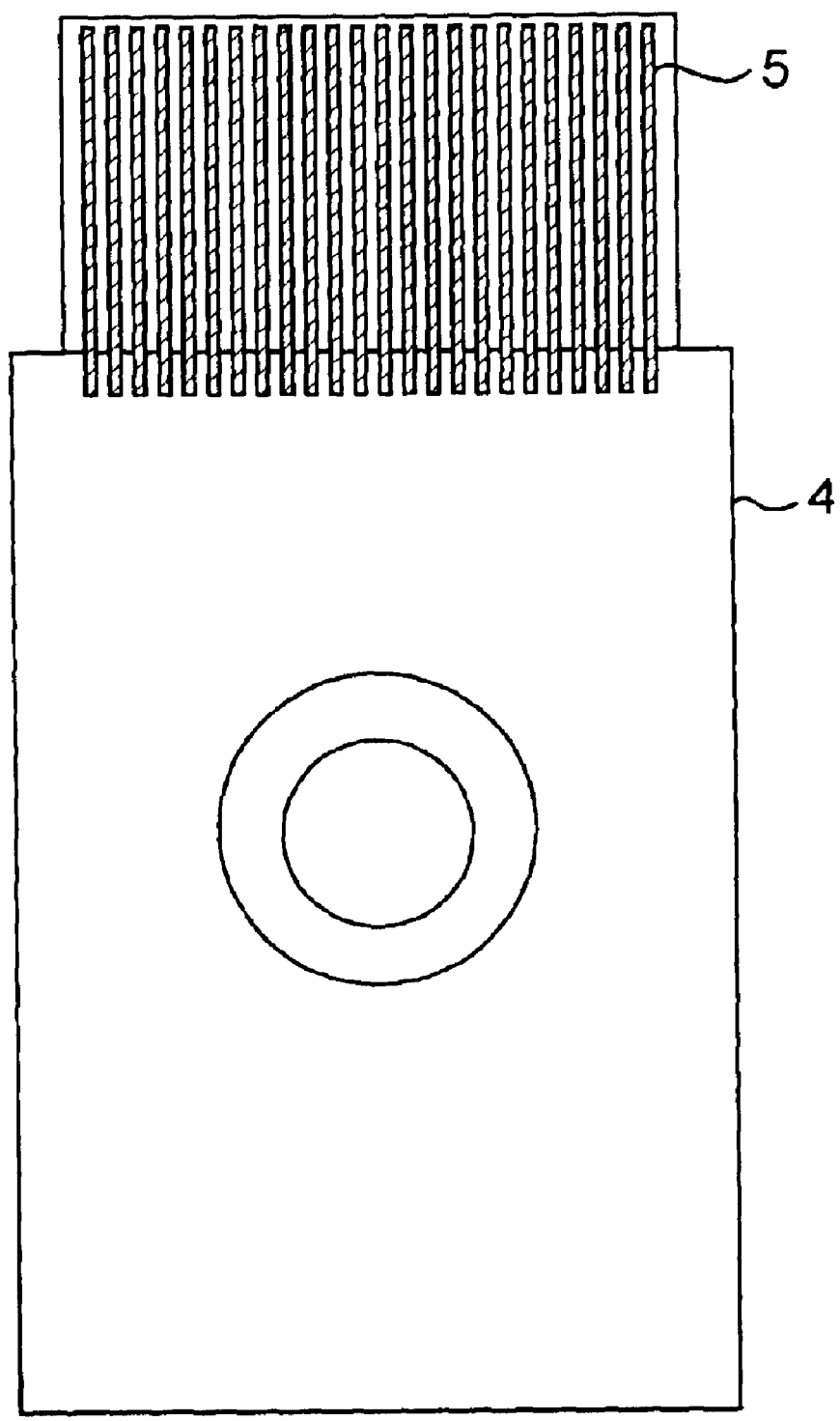
FIG. 7 is a top plan view showing a substrate of a conventional probe card.

FIGS. 4 to 6 are top plan views each showing a mother board 4 (hereinafter referred to as "probe card substrate") for a probe card according to an embodiment 2 of the present invention. FIG. 7 is a top plan view showing a conventional probe card substrate 4 for comparison.

The conventional probe card substrate 4 shown in FIG. 7 is provided with connector electrodes 5 at only one side thereof. In this case, however, the connector electrodes 5 are used for the chip test or wafer test, so that there is no free electrode remained. Accordingly, there may be a case where the wires $L_1, L_2, L_3, \ldots, L_n$ for an exclusive use for the contact check of each pin can not be provided to be drawn from each pin, separate from those for measuring chip performance. Thus, the probe card cannot be realized having a configuration shown in FIGS. 2 and 3.

In view of this fact, further connector electrodes 6 are provided for a probe card check, separate from those for the wafer test and chip test, as shown in FIGS. 4 to 6. By this configuration, the connector electrodes 6 for the probe card check can be used even if there are no free connector electrodes 5 which are used for the wafer test and chip test.

These probe card substrates 4 are used in a manner such that, when performing the wafer test and chip test, the connector electrodes 5 for the wafer test and chip test are inserted to connectors (not shown) on a tester, while the connector electrodes 6 for the probe card check are inserted into the checker 101 to be used upon the probe card check.

Embodiment 3

Figure 8:
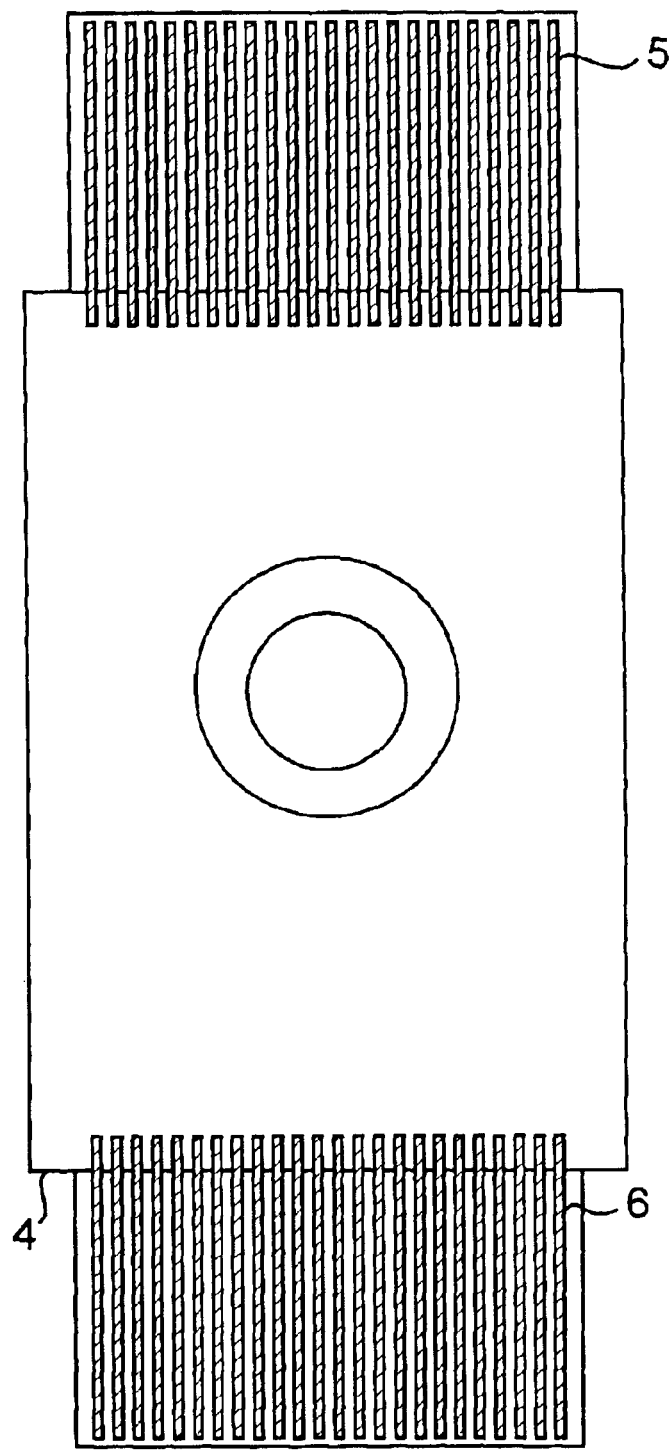
FIG. 8 is a top plan view showing a substrate of a probe card according to an embodiment 3 of the present invention.
Figure 9:
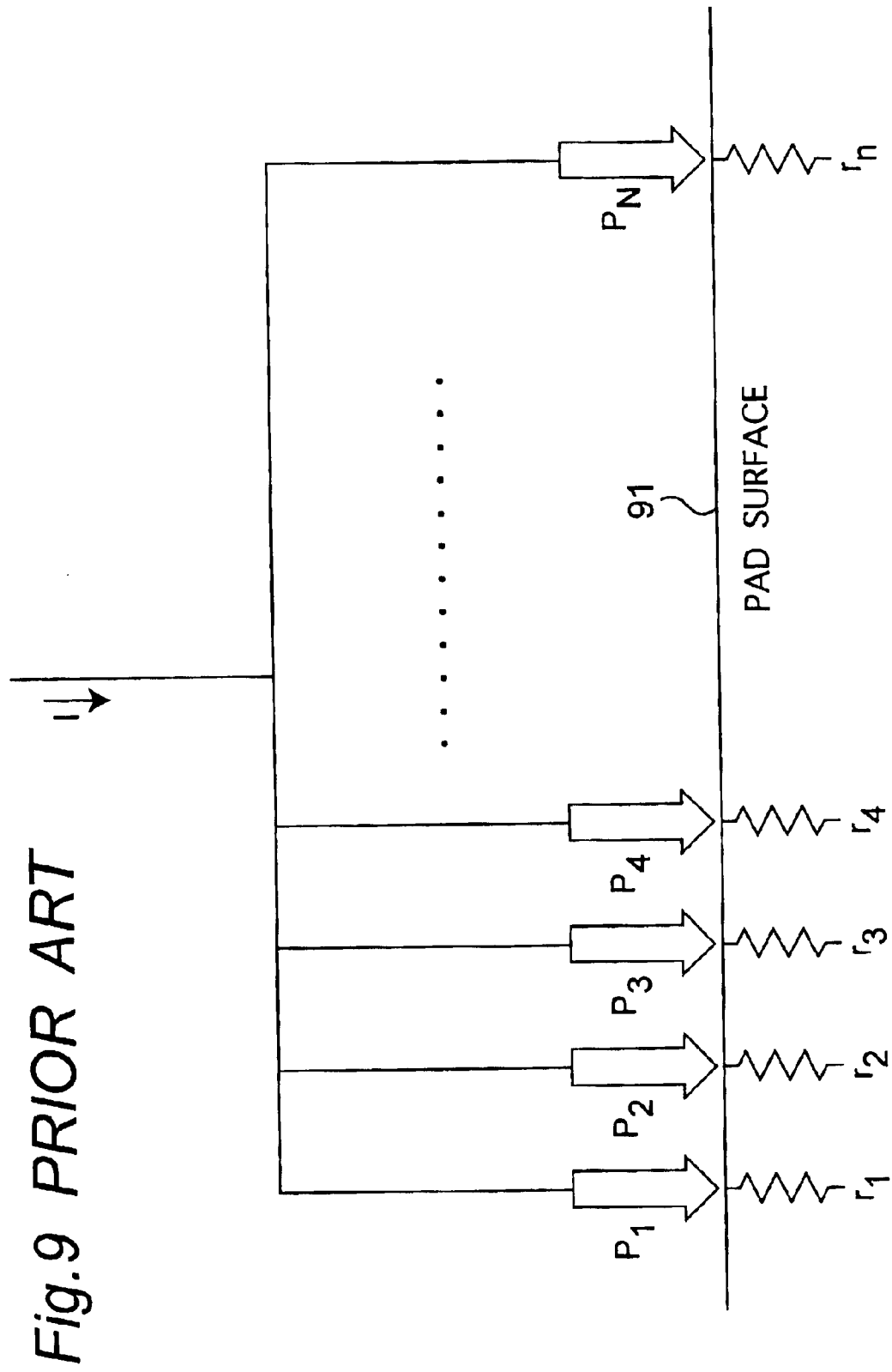
FIG. 9 is an equivalent circuit diagram of a conventional probe card.
Figure 10:
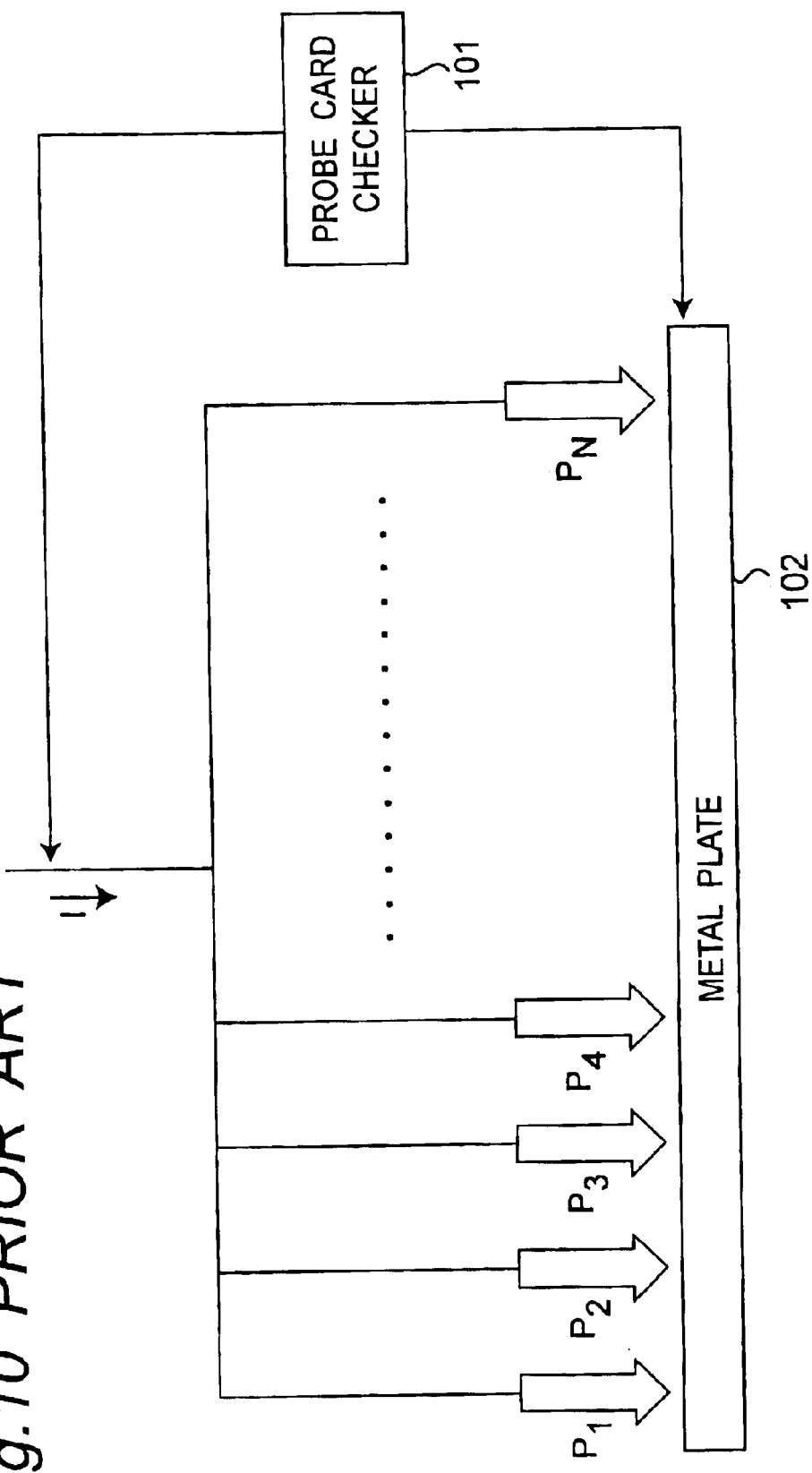
FIG. 10 is an equivalent circuit diagram when a contact check of the probe card shown in FIG. 9 is performed.

FIG. 8 shows a probe card substrate 4 according to an embodiment 3 of the present invention which is a modified example of the above-mentioned embodiment 2. In this embodiment, the probe card substrate 4 has connector electrodes 5 for the wafer test and chip test mounted on one side thereof and connector electrodes 6 for the probe card check that are provided on the side opposite thereto, separate from the connector electrodes 5. The connector electrodes 6 have a size and shape same as those of the connector electrodes 5.

By this configuration, an improved model of the probe card check can be realized by using the conventional probe card checker 101.

Although the embodiments 1 to 3 of the present invention exemplify a probe card used for performing a test of a semiconductor power device in a wafer state and chip state, the present invention is not limited thereto. The invention can be applied to the other probe card used for a test during a production process of a semiconductor device.

As described above, according to a first aspect of the present invention, a probe card is provided with a plurality of probe pins for carrying high current for the test and a balance resistance connected in series to each probe pin, the resistance having a value greater than a contact resistance produced when each of the plurality of probe pins is brought into contact with the chip pad of the semiconductor device. Each of the probe pins is provided with a contact check wire for checking a contact performance of each probe pin, and each wire is drawn from a junction point positioned between each probe pin and the resistance connected thereto.

By this configuration, a high applied current can be well-balanced to flow through each probe pin, to thereby prevent a burnout of a chip pad as well as a burnout of the probe pins due to concentrated current flow on a part of the pins, resulting in enhancing a measuring precision of a test, and further makes it possible to individually check as to whether each probe pin has a defect or not even in the case where each of the plurality of probe pins is electrically short-circuited for use.

According to a second aspect of the present invention, a probe card is provided on its substrate with a first connector electrode section for a performance test of a chip and a second connector electrode section for checking the probe card. This configuration affords the same effect as the first aspect even in the case where the connector electrodes for checking contact is lacking in number in a normal probe card substrate.

According to a third aspect of the present invention, a probe card has the first connector electrode section for the performance test of a chip and the second connector electrode section for checking the probe card, both electrode sections having the same size and same shape, and mounted respectively at two opposing sides of the substrate of the probe card. Thus, an effect of realizing an improved probe card can be obtained with use of a conventional probe card checker as it is.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A probe card for use in a performance test of a chip of a semiconductor device in a production process of the semiconductor device, the probe card comprising:
   a plurality of probe pins for flowing a high current therethrough for the test, each of the probe pins having a balance resistance connected thereto in series, each balance resistance having a value greater than a contact resistance between each of the probe pins and a chip pad of the semiconductor device which are brought into contact with each other; and
   a plurality of contact check wires for checking a contact performance of each of the probe pins, wherein each of the contact check wires is drawn from a junction point positioned between each of the probe pins and a corresponding balance resistance connected thereto.

2. The probe card as claimed in claim 1, having a first connector electrode section for a performance test of a chip and second connector electrode section for checking the probe card per se, wherein both of the first and second connector electrode sections are separately mounted on a substrate of the probe card.

3. The probe card as claimed in claim 2, wherein the first connector electrode section for the performance test of a chip and the second connector electrode section for checking the probe card have the same size and same shape with each other, and are mounted respectively at two opposing side portions of the substrate of the probe card.

* * * * *